United States Patent [19]

Carey

[11] Patent Number: 4,926,241

[45] Date of Patent: May 15, 1990

[54] FLIP SUBSTRATE FOR CHIP MOUNT

[75] Inventor: David H. Carey, Austin, Tex.

[73] Assignee: Microelectronics and Computer Technology Corporation, Austin, Tex.

[21] Appl. No.: 157,778

[22] Filed: Feb. 19, 1988

[51] Int. Cl.$^5$ .............................................. H01L 23/16
[52] U.S. Cl. ........................................ 357/75; 357/71;
357/74; 357/80
[58] Field of Search ............................. 357/74, 71, 75

[56] References Cited

U.S. PATENT DOCUMENTS

| | | | |
|---|---|---|---|
| 4,082,394 | 4/1978 | Gedney et al. | 357/74 |
| 4,322,778 | 3/1982 | Barbour et al. | 361/414 |
| 4,652,974 | 3/1987 | Ryan | 361/395 |
| 4,665,468 | 5/1987 | Dohya | 361/414 |
| 4,667,219 | 5/1987 | Lee et al. | 357/74 |
| 4,667,220 | 5/1987 | Lee et al. | 357/74 |
| 4,682,207 | 7/1987 | Akasaki et al. | 357/74 |
| 4,685,033 | 8/1987 | Inoue | 361/414 |
| 4,811,082 | 3/1989 | Jacobs et al. | 357/74 |

FOREIGN PATENT DOCUMENTS

| | | | |
|---|---|---|---|
| 0981799 | 1/1976 | Canada | 357/71 |
| 0176245 | 4/1986 | European Pat. Off. | 357/71 |
| 0031146 | 2/1987 | Japan | 357/71 |
| 0165350 | 7/1987 | Japan | 357/74 |

OTHER PUBLICATIONS

Blodgett, "Microelectronic Packaging", Scientific American, Jul. 1983, pp. 86-96.

Primary Examiner—Andrew J. James
Assistant Examiner—Courtney A. Bowers
Attorney, Agent, or Firm—Fulbright & Jaworski

[57] ABSTRACT

A substrate for attaching electrical devices having an interconnect wiring structure and a support for the interconnect, the support having a number of vias, or throughholes, extending therethrough and electrically connected to the interconnect. The substrate allows for attachment of the electrical devices on the side of the support opposite the interconnect at the vias, rather than on the interconnect itself. By so doing, the chips can be packed more densely since the area between the chips normally reserved for engineering change pads, test pads and the like is not required, these functions being performed on the interconnect on the opposite side of the substrate.

18 Claims, 3 Drawing Sheets

FLIP SUBSTRATE FOR CHIP MOUNT

BACKGROUND OF THE INVENTION

The present invention relates to an improved substrate design for application in integrated circuitry. Specifically, the present invention relates to a substrate design for attaching and interconnecting electrical and electronic devices, especially integrated circuit chips.

Current multi-chip circuitry design requires attachment to a substrate of electrical and electronic devices, oftentimes in the form of integrated circuit (I.C.) chips. The substrate, which includes an interconnect wiring structure and a support therefore, electrically connects the chips. Presently known attachments involve the attachment of the chips directly to the interconnect, thus forming a multilayer structure of support-interconnect-chips.

The interconnect surface serves a number of services in addition to chip attachment. For example, the interconnect surface provides for test pads for testing the attached circuitry and underlying wiring, for engineering change pads for rewiring the circuitry, for termination resistors, for repair to the circuitry, and so on. These different functions and their attendant structures compete with chip attachment structures for room on the interconnect. As a result, the chip packing density is less than optimal because space must be left between the chips for these other various structures. As more and more structure is required on the interconnect surface, the chip density declines. Optimally, the chip density should approach 100% in a planar multi-chip module.

Accordingly, there exists a need for a substrate structure which is capable of supporting the many structures and functions required of such substrates, while optimizing chip density.

SUMMARY OF THE INVENTION

It is therefore an object of the present invention to provide a substrate for attaching electrical and electronic devices which provides high chip density.

Another object of the present invention is to provide a substrate design having high chip density, while at the same time providing surface area for the related functions of testing, repairing, changing, and the like.

Yet another object of the invention is to provide a substrate which achieves the high chip density properties mentioned above and which further provides for discretionary wiring interconnect.

Still yet another object of the invention is to provide a substrate which uses the more rugged support surface of the substrate for device attachment so that the integrity of the delicate interconnect is not jeopardized by soldering and bonding.

It is also an object of the present invention to provide a method for attaching electrical devices to a substrate which optimizes chip density.

Thus, there is provided in accordance with one aspect of the present invention, a substrate for attaching electrical and electronic devices comprising a wiring interconnect and a support structure for supporting the interconnect which includes means on one side thereof for attaching to the interconnect, means on the other side thereof for attaching to electrical and electronic devices, and a plurality of vias extending therethrough and electrically connecting the devices to the interconnect. The vias are preferably arranged in a grid design or in alignment with outer lead bondsites of a chip having peripheral bonding and can be electrically connected to the integrated circuit chip. Additionally, the vias can be filled completely with a conductive material or simply can be coated along their walls with a conductive material.

In accordance with another aspect of the present invention, there is provided a method for attaching an electrical device to a substrate which comprises the step of attaching the device to the substrate at at least one via extending through the substrate, wherein the via is electrically connected to an interconnect structure on the opposite side of the substrate.

The present invention provides for "brickwalling" of the attached electrical devices, primarily I.C. chips. "Brickwalling" refers to that condition in which the chips are placed on the substrate very near one another, much like the positioning of brick in a brickwall. In so doing, the density on the chips per unit area of substrate is increased, approaching 100%. The density measurement here refers to the density as measured in the surface plane of the support. Further, the thin-film interconnect surface is freed for testing, engineering changes, terminations, module input/output ("I/O") and decoupling.

Another advantage of the present substrate is that chip attachment occurs on the support surface and not on the thin-film interconnect. The support provides a more robust, planar surface reducing concerns for interconnect damage during bonding.

Still another advantage of the present substrate is that the vias can provide for a self-alignment between the chip and the substrate.

Also, if a silicon support is used for the substrate, a better thermal coefficient of expansion match exists between the chip and substrate. Accordingly, large area controlled collapse chip connection (C4) can be considered.

Other objects, features and advantages of the present invention will be apparent from a review of the detailed description of preferred embodiments which follows, when considered together with the drawings, a brief description of which follows.

DETAILED DESCRIPTION OF PREFERRED EMBODIMENTS

Recent developments in integrated circuitry have led to a continuing increase in the number of semiconductor chips per unit area to be attached to the underlying substrate. As the demand for chip space increases, it encroaches on and highlights the competing demand for space on the interconnect substrate between the chip and the structures for performing other important functions, such as repairing and testing.

Figure 1:
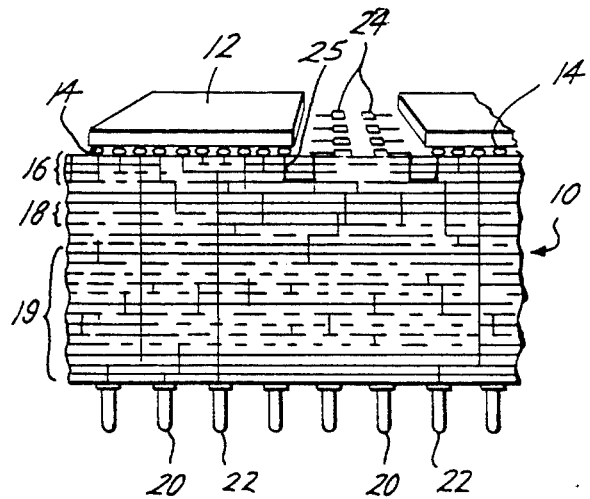
FIG. 1 is a cross-sectional view of a prior art substrate.

FIG. 1 shows a prior art substrate 10 having chips 12 attached thereto. The substrate is a multilayer structure having redistribution layers 16 near the top of the substrate, followed by an interconnect structure 18 of x- and y-wiring. The remaining substrate structure comprises signal distribution and signal reference layers and power distribution and module I/0 layers (19). The lower portion of the substrate includes a number of signal pins 20 and ground pins 22. The interconnect 18 of the substrate electrically connects the numerous electrical devices, primarily chips, that comprise a typical multi-chip modular package.

FIG. 1 illustrates the competing demand for chip attach space and the demand for space to perform other important functions. As can be seen, a significant area of the surface of the substrate 10 is utilized for attachment of the chip 12. At the same time, space is required on the substrate surface for test pads 24. As shown, a line 25 extends from the chip bondsites or nodes 14 to pads 24. The pads provide an accessible mechanism for testing the viability of the individual chip attach points.

Figure 2:
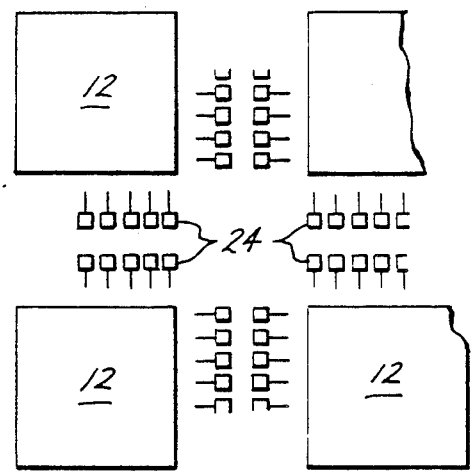
FIG. 2 is a plan view of the substrate of FIG. 1.

FIG. 2 illustrates the chip/test pad structure and the competition between the structures and their attendant functions for substrate surface.

The chip attach space problem is magnified in those structures which, unlike the flip-chip bonding of FIGS. 1 and 2, utilize outer lead, peripheral or area bonding OLB's. In these embodiments, the chip bondsites are brought to the periphery of the chips by lead lines. The advantage in the design is the accessibility of the bondsites to testing. The disadvantage is that the chip effectively uses more surface area for attachment.

In order to solve the problem of interconnect surface availability, the present invention utilizes a "flip" substrate. In other words, the substrate can be viewed as being flipped so that its thin-film interconnect is on the side of the substrate opposite the chip. The support structure of the substrate thus is adjacent to the chip. In order to achieve the necessary attachment between the chip and interconnect, vias, or passageways, are provided from bondsites on the interconnect through the support to chip attach pads at the support surface immediately adjacent the chip. The vias are filled or coated with an electrically conductive material or otherwise designed to provide an electrical connection between the interconnect and the chip.

Figure 3:
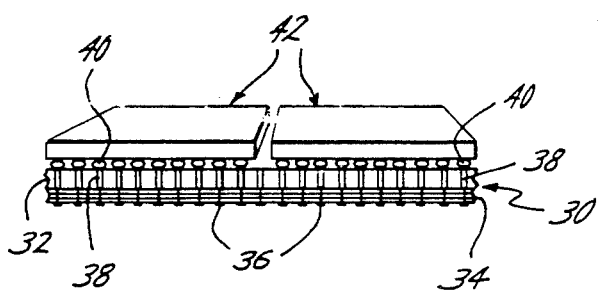
FIG. 3 is a cross-sectional view of a substrate according to the present invention.

FIG. 3 illustrates a substrate according to the present invention. The substrate 30 includes a support structure 32 and a thin-film interconnect structure 34. The interconnect is a photolithographically defined set of strip transmission lines which interconnect chips in multi-chip modules, cards and boards. The interconnect is designed to provide a number of surface access pads 36. In presently available designs these pads would be directly attached to the chip, either at the chip's inner bondsites or nodes 14 (FIG. 1) or at outer bondsites ("OLB's") as previously described.

According to the present invention, however, the surface access pads are indirectly attached to the chips by posts from the lower interconnect surface to sites at the interconnect/support interface. These posts, in turn, are electrically connected to vias 38 which extend vertically through the support 32.

The vias are electrically conductive passageways connecting the interconnect to the nodes of the chips. The vias may be filled completely or the walls may be coated with a conductive material or may be otherwise treated so long as a conductive connection is made between interconnect and chip.

The vias terminate at their upper end at points which mate with the particular chip attach scheme. In FIG. 3, the vias 38 mate directly with the nodes 40 of the chips 42.

An advantage of the present structure is that surface access pads 36 can be smaller than the corresponding chip attach pads of presently available interconnects. In the latter structures, the pads are required to have a certain area in order to facilitate and assure adequate contact with the chips. Since the connections are now made at the vias and translated to the access pads 36, the pads may be smaller. As such, additional wiring is achievable on the interconnect.

Figure 4:
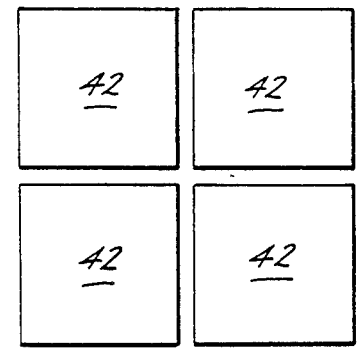
FIG. 4 is a plan view of the substrate of FIG. 3.

FIG. 4 is a plan view illustrating the close arrangement achieved by adjacent chips 42. This view shows why the present structure is said to provide for "brick-walling" chips.

Figure 5:
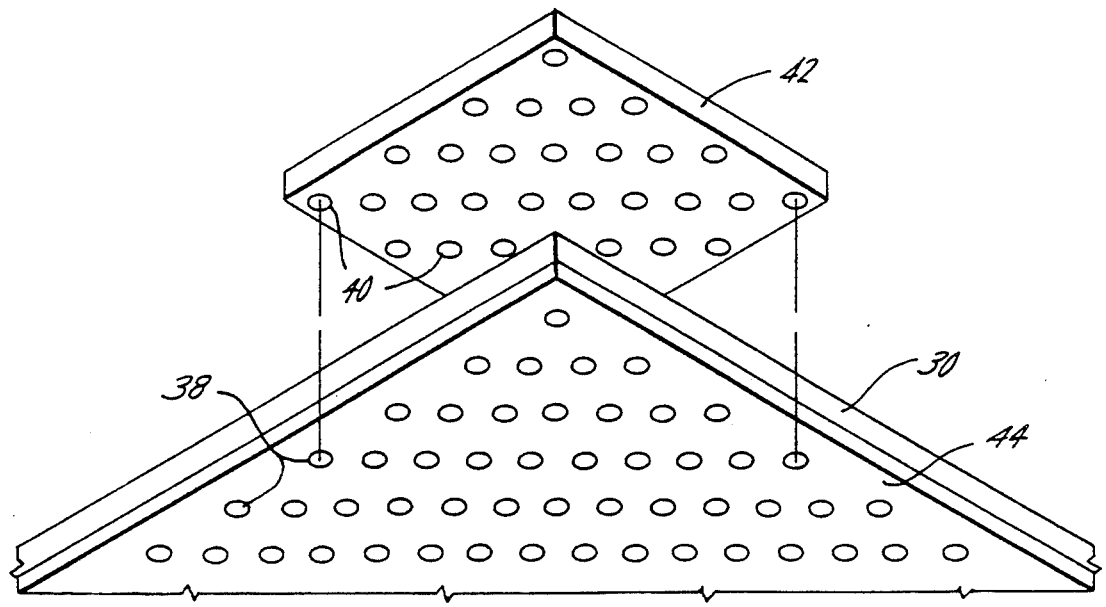
FIG. 5 is an exploded isometric view of a substrate according to the present invention and a chip for attachment thereto.

FIG. 5 shows how a chip 42 is attached to a substrate 30 so as to align the vias 38 with the nodes 40 of the chip or chip package. FIG. 5 also shows that the remainder of the interconnect surface 44 is available for performing additional functions necessary for such modular packages. A non-exhaustive list of functions includes engineering changing, repair, testing, module I/O attachment, terminations and decoupling.

An additional advantage of the present structures is that the vias may be designed so as to promote alignment with the nodes 40 of the chip. This ensures proper electrical contact between the two structures.

Figure 6:
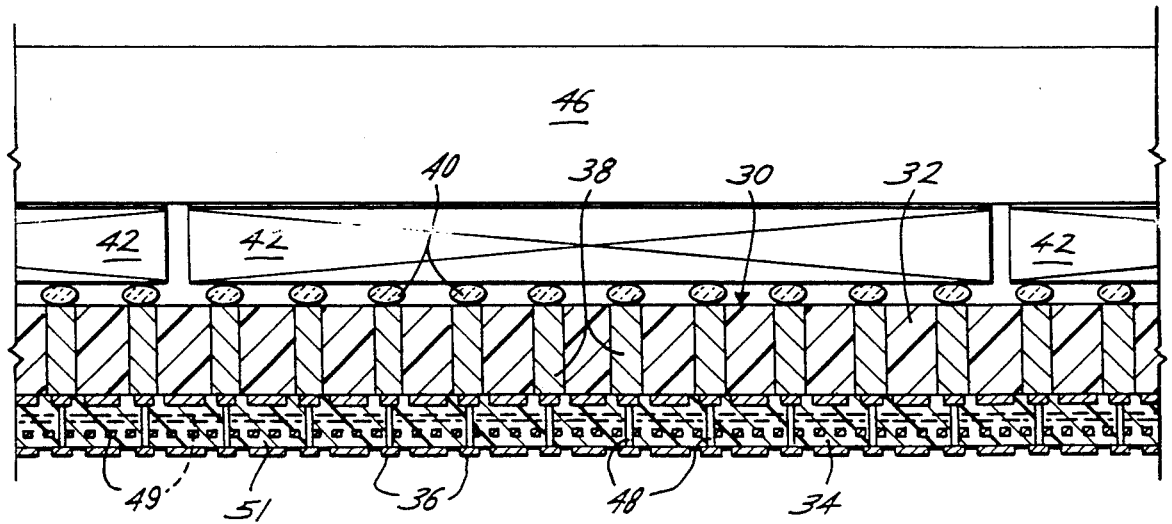
FIG. 6 is an enlarged cross-sectional view of a substrate according to the present invention.

FIG. 6 shows the chip and substrate attachment in more detail. The chips 42 are shown having a heat sink 46 or cold plate on their side opposite the substrate 30. The heat sink 46 is a standard item in modules of this type and is necessary to dissipate the heat build-up in chips. The nodes 40 of the chips are illustrated to be in alignment with and electrically connected to the vias 38 of the support 32. The vias, in turn, attach to posts 48 which terminate at surface access pads 36. The interconnect 34 is shown as a series of x and y wires 49 extending through and surrounded by a non-conductive, insulative material 51.

Figure 7:
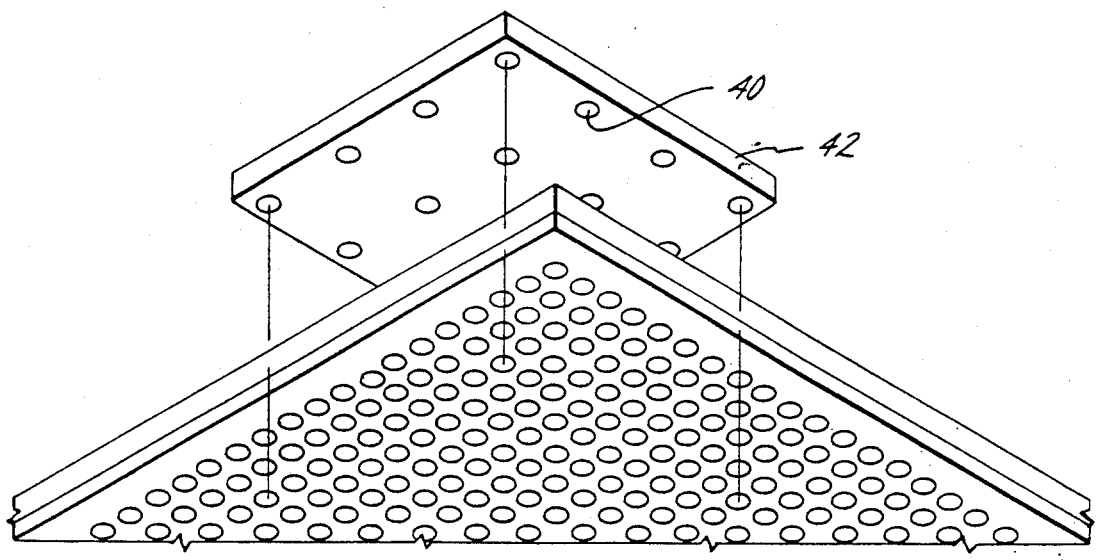
FIG. 7 is an exploded isometric view of a substrate similar to the substrate of FIG. 5.

FIG. 7 is similar to FIG. 5, except that the number of nodes 40 on the chip 42 is less than what is shown in FIG. 5.

Figure 8:
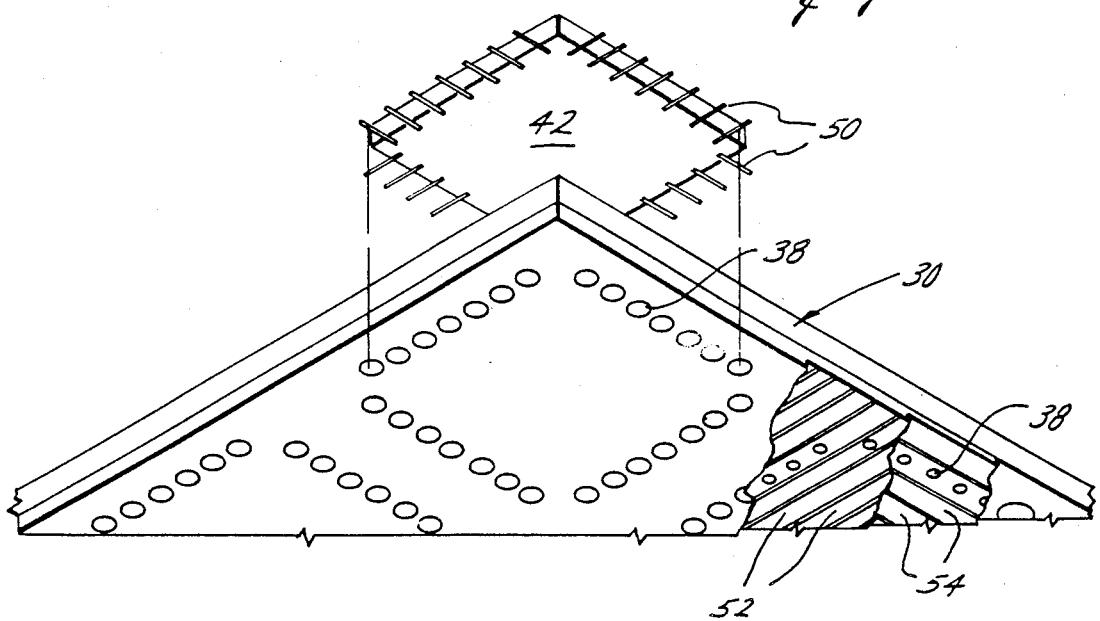
FIG. 8 is an exploded isometric view of a substrate according to the present invention, but with vias aligned with leads from the inner bond sites of the chip. The figure also shows a cutaway of the substrate detailing the thin-film interconnect structure.

FIG. 8 illustrates an embodiment of the present substrate having a peripheral via arrangement corresponding to lead lines 50 extending from the chip. As shown, the vias 38 extend through the substrate and will attach to the chip along the beam leads 50. As mentioned earlier, this arrangement offers the advantage that the chip to substrate bond is uncovered and is more accessible to inspection, compared to the bonds shown in FIGS. 5–7. A disadvantage to this arrangement, of course, is the additional space taken up by each chip. This reduces the chip density on the substrate.

It is preferred that the vias be arranged in a regular grid pattern. Such an arrangement adapts with a "discretionary" interconnect, such as that described in co-pending U.S. Application Ser. No. 102,172, filed Sept. 29, 1987 now abandoned in preference to a continuation application Ser. No. 07/344,534 filed April 25, 1989. This makes possible a completely standardized substrate employing the advantages described above. The regular pattern allows a regular device attach scheme such as area "tape automated bonding" (TAB) or controlled collapse chip connection (C4). If the latter approach is employed, a near-100% device packing density can be realized with the advantage of higher performance over less densely packed devices. The regular pattern also allows a continuous sheet of connections to be developed at the interface between chip and substrate. The increased spacing between attachment points gained by the use of a regular area grid patterns, instead of dense peripheral or linear attach, also enhances the manufacturing and assembly of electronic modules.

FIG. 8 also shows the x- and y-wiring scheme of the interconnect. As illustrated, the interconnect comprises a first set of transmission wires 52 extending in the y-direction and a second set of wires 54 extending in the x-direction orthogonal to the first set of wires. The vias 38 are shown extending through the wires.

Of course, other interconnect schemes can be used, for example, multiple x and y wire planes, diagonal wiring, reference planes, and the like can be envisioned. Also, though not shown in the drawings, reference and voltage planes can be included in the substrate.

The substrate can be formed from a support material through which a number of vias are created. The support material can be selected from any number of materials which provide the needed support to the interconnect and the thermal and physical properties for proper package operations. Examples of advantageous support materials are silicon, ceramic, glass, and metals. Particularly preferred are those materials having advantageous thermal coefficient of expansion (TCE) match with the chip. This aspect will be described in more detail below.

The vias can be formed by a number of techniques. For example, the via pattern may be established by a photoresist and then etched away The vias can then be back-filled or coated with a conductive material. Other techniques for forming the vias include punching of green ceramic, laser drilling, photo-machining, and crystalligraphic etching. Suggested conductive materials include copper, tungsten, gold, and nickel. The choice of conductive material is based upon the adhesion characteristics with the chosen support material and the method chosen for rendering the hole conductive.

The vias are arranged depending on the specifications of the chip. As already discussed, the vias can be positioned in any number of positions, with the grid pattern preferred due to its ease in manufacture and bonding. Further, the shape of the vias is not controlling as long as the proper electrical connection is achieved between the interconnect and chip.

Once the support is formed, the thin-film interconnect is processed onto the support. The interconnect structure comprises a plurality of thin transmission lines surrounded by a non-conductive, insulative material. A suggested material for the transmission lines is copper surrounded by polyimide. The transmission lines are arranged in a network and interconnected depending on user needs. The transmission lines may be a customized network or a discretionary network as disclosed in co-pending application U.S. Ser. No. 102,172 now abandoned in preference to a continuation application Ser. No. 07/344,534 filed April 25, 1989 mentioned above. It may be advantageous to "personalize" or interconnect the wiring network prior to chip attachment.

Once the substrate is complete, the I.C. chips are mounted onto the non-interconnect side of the substrate. The present invention offers a still further advantage at this step in the operation. The support surface is a more rugged surface than is the interconnect. Thus, by attaching the chips to the support rather than the interconnect, the integrity of the delicate interconnect is not jeopardized by the soldering or bonding of the chips. Also, the support allows for lower thermal expansion mismatch with the chip. This reduces the development of a shearing force between the chip and the substrate at the chip attach points.

The chips can be attached to the vias by a variety of well-known techniques, such as soldering, thermocompression bonding, pressure contact, and the like.

Thus, the present invention provides an improved substrate for attaching and connecting the many electrical devices, typically in the form of I.C. chips, necessary in digital circuitry. The present substrate provides improved device packing density by the migration of area-consuming functions, such as test/engineering change pads, termination resistors, etc. to a different plane from the chip attachment plane. Further, the substrate does not jeopardize the delicate interconnect during device attachment since the attachment is done on the more rugged support surface.

The present invention, therefore, is well adapted to carry out the objects and attain the ends and advantages mentioned, as well as others inherent therein. While presently preferred embodiments of the invention have been described for the purpose of disclosure, numerous changes in the details of construction and arrangement of parts may be made without departing from the spirit of the present invention and the scope of the appended claims.

What is claimed is:

1. An integrated circuit packaging structure comprising:
    an integrated circuit element including a plurality of internal circuits integrated into a single semi-conductor element, said integrated circuit element having an upper surface and a lower surface, and being formed having an array of conductive nodes protruding from said lower surface to provide electrical coupling to said internal circuits;
    a support substrate having an upper surface and a lower surface, said substrate having a plurality of through vias formed therein and extending from said upper surface to said lower surface, said through vias being formed in a pattern corresponding to said array of conductive nodes on said lower surface of said integrated circuit element; said substrate further comprising conductor means within said through vias and extending from said substrate upper surface to said substrate lower surface;
    an electrical interconnect layer comprising a plurality of electrically conductive interconnect elements distributed within an electrically insulating material, said interconnect layer having an upper surface and a lower surface, said interconnect layer further having a plurality of conductive coupling elements extending from said upper surface to said lower surface of said interconnect layer, said coupling elements being arranged in a pattern corresponding to said array of conductive nodes on said integrated circuit element and being adapted for coupling to said interconnect elements within said interconnect layer; and wherein said lower surface of said integrated circuit element is formed adjacent to said upper surface of said substrate so as to align said conductive nodes with said through vias and to electrically couple said conductive nodes with said conductor means; said upper surface of said interconnect layer is formed adjacent to said lower surface of said substrate so as to align said coupling elements with said through vias and to electrically couple said coupling elements with said conductor means.

2. The package of claim 1 wherein said integrated circuit element and said support substrate are formed of material having equivalent coefficients of thermal expansion.

3. The package of claim 1, wherein said conductor means within said through vias in said substrate comprise a conductive element substantially filling said through vias.

4. The package of claim 1, wherein said through vias comprise a bore extending through said substrate from said upper surface to said lower surface, said bore being defined by a bore wall, and wherein said conductor means within said through vias comprise a conductive lining formed adjacent said bore wall.

5. The package of claim 1, wherein said electrical interconnect layer comprises a plurality of electrical conductor elements distributed within a layer of polyimide insulating material.

6. The package of claim 5, wherein said electrical conductor elements are formed of copper.

7. The package of claim 1, wherein said conductive nodes of said integrated circuit element are soldered to said conductor means of said substrate.

8. The package of claim 1, wherein said conductive nodes of said integrated circuit element are coupled to said conductor means of said substrate by thermo bonding.

9. The package of claim 1, wherein said conductive nodes of said integrated circuit are coupled to said conductor means of said substrate by pressure contact.

10. The package of claim 1, wherein said conductive coupling elements of said interconnect layer comprise a conductive lead extending from said upper surface to said lower surface of said interconnect layer.

11. The package of claim 10, wherein said conductive coupling elements have an upper end and a lower end, said upper and lower ends being adjacent said upper and lower surfaces of said interconnect layer, said conductive elements further comprising a conductive pad electrically coupled to said lower end of said conductive elements.

12. The package of claim 1, wherein said support substrate includes a conductive voltage plane.

13. An integrated circuit packaging structure comprising:

an integrated circuit element comprising a plurality of internal circuits integrated into a single semiconductor element, said integrated circuit element having an upper surface, a lower surface and a peripheral edge, said integrated circuit element being formed having a plurality of conductive leads extending from said peripheral edge to provide electrical coupling to said internal circuits;

a support substrate having an upper surface and a lower surface, said substrate having a plurality of through vias formed therein extending from said upper surface to said lower surface, said through vias being formed in a pattern corresponding to the arrangement of said conductive leads of said integrated circuit element, said substrate further comprising conductor means within said through vias and extending from said substrate upper surface to said substrate lower surface;

an electrical interconnect layer comprising a plurality of electrically conductive interconnect elements distributed within an electrically insulating material, said interconnect layer having an upper surface and a lower surface, said interconnect layer further having a plurality of conductive coupling elements extending from said upper surface to said lower surface of said interconnect layer, said coupling elements being arranged in a pattern corresponding to the arrangement of said conductive leads of said integrated circuit element and being adapted for coupling to said interconnect elements within said interconnect layer; and wherein said lower surface of said integrated circuit element is formed adjacent to said upper surface of said substrate so as to align said conductive leads with said through vias and to electrically couple said conductive leads with said conductor means; said upper surface of said interconnect layer is formed adjacent to said lower surface of said substrate so as to align said coupling elements with said through vias and to electrically couple said coupling elements with said conductor means.

14. The package of claim 13 wherein said integrated circuit element and said support substrate are formed of material having equivalent coefficients of thermal expansion.

15. The package of claim 13 wherein said conductor means within said through vias comprise a conductive element substantially filling said through vias.

16. The package of claim 13 wherein said through vias comprise a bore extending through said substrate from said upper surface to said lower surface, said bore being defined by a bore wall, and wherein said conductor means within said vias comprise a conductive lining formed adjacent said bore wall.

17. An integrated circuit packaging structure of the type adapted to receive an integrated circuit element including a plurality of internal circuits integrated into a single semi-conductor element, the single semi-conductor element being of the type having an upper surface and a lower surface and being formed having an array of conductive nodes protruding from the lower surface to provide electrical coupling to the internal circuits, said packaging structure comprising:

a support substrate having an upper surface and a lower surface, said substrate having a plurality of through vias formed therein extending from said upper surface to said lower surface, said through vias being formed in a pattern corresponding to the array of conductive nodes of the lower surface of the integrated circuit element; said substrate further comprising conductor means within said through vias and extending from said substrate upper surface to said substrate lower surface;

an electrical interconnect layer comprising a plurality of electrically conductive interconnect elements distributed within an electrically insulating material, said interconnect layer having an upper surface and a lower surface, said interconnect layer further having a plurality of conductive coupling elements extending from said upper surface to said lower surface of said interconnect layer, said coupling elements being arranged in a pattern corresponding to the array of conductive nodes on the integrated circuit element and being adapted for coupling to said interconnect elements within said interconnect layer; and wherein the lower surface of the integrated circuit element is formed adjacent to said upper surface of said substrate so as to align the conductive nodes with said through vias and to electrically couple the conductive nodes with said conductor means; said upper surface of said interconnect layer is formed adjacent to said lower surface of said substrate so as to align said coupling elements with said through vias and to electrically couple said coupling elements with said conductor means.

18. An integrated circuit packaging structure of the type adapted to receive an integrated circuit element including a plurality of internal circuits integrated into a single semi-conductor element, the semi-conductor element being formed having an upper surface a lower surface, and a peripheral edge and having a plurality of conductive leads extending from the peripheral edge to provide electrical coupling to the internal circuits, said packaging structure comprising:

a support substrate having an upper surface and a lower surface, said substrate having a plurality of through vias formed therein extending from said upper surface to said lower surface, said through vias being formed in a pattern corresponding to the arrangement of the conductive leads of the integrated circuit element, said substrate further comprising conductor means within said through vias and extending from said substrate upper surface to said substrate lower surface;

an electrical interconnect layer comprising a plurality of electrically conductive interconnect elements distributed within an electrically insulating material, said interconnect layer having an upper surface and a lower surface, said interconnect layer further having a plurality of conductive coupling elements extending from said upper surface to said lower surface of said interconnect layer, said coupling elements being arranged in a pattern corresponding to the arrangement of the conductive leads of the integrated circuit element and being adapted for coupling to said interconnect elements within said interconnect layer; and wherein the lower surface of said integrated circuit element is formed adjacent to said upper surface of said substrate so as to align said conductive leads with said through vias and to electrically couple said conductive leads with said conductor means; said upper surface of said interconnect layer is formed adjacent to said lower surface of said substrate so as to align said coupling elements with said through vias and to electrically couple said coupling elements with said conductor means.

* * * * *